United States Patent
Nakagawa et al.

(10) Patent No.: US 11,502,676 B2
(45) Date of Patent: Nov. 15, 2022

(54) DRIVER CIRCUIT AND SEMICONDUCTOR DEVICE

(71) Applicant: FUJI ELECTRIC CO., LTD., Kanagawa (JP)

(72) Inventors: Sho Nakagawa, Matsumoto (JP); Morio Iwamizu, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/940,405

(22) Filed: Jul. 28, 2020

(65) Prior Publication Data
US 2021/0075415 A1    Mar. 11, 2021

(30) Foreign Application Priority Data

Sep. 6, 2019  (JP) .............................. JP2019-163026

(51) Int. Cl.
| | | |
|---|---|---|
| H03K 17/082 | (2006.01) | |
| H03K 17/06 | (2006.01) | |
| H03K 17/08 | (2006.01) | |
| H03K 19/00 | (2006.01) | |

(52) U.S. Cl.
CPC ....... *H03K 17/0822* (2013.01); *H03K 17/063* (2013.01); *H03K 19/0027* (2013.01); *H03K 2017/0806* (2013.01)

(58) Field of Classification Search
CPC ............ H03K 17/0822; H03K 17/063; H03K 19/0027; H03K 2017/0806
See application file for complete search history.

(56) References Cited

U.S. PATENT DOCUMENTS

| | | | | |
|---|---|---|---|---|
| 4,682,047 A | * | 7/1987 | von Sichart | G01R 19/16519 326/34 |
| 5,483,404 A | | 1/1996 | Nakano | |
| 9,000,811 B2 | * | 4/2015 | Wang | H03K 17/163 327/108 |
| 2009/0002055 A1 | | 1/2009 | Kojima | |

FOREIGN PATENT DOCUMENTS

| | | |
|---|---|---|
| JP | H0883909 A | 3/1996 |
| JP | 2009010477 A | 1/2009 |

OTHER PUBLICATIONS

Morisawa Yuka et al., High-Side 2-in-1 "F5114H" for Automobiles, Fuji Electric Review vol. 62—No. 4 2016, p. 261-264.

* cited by examiner

*Primary Examiner* — Ryan Johnson
*Assistant Examiner* — Colleen J O Toole

(57) ABSTRACT

Provided is a driver circuit that controls an output unit that switches whether or not to supply a current to an output line, in accordance with a potential difference between a first control signal to be input and a voltage of the output line. The driver circuit comprises a control line that transmits the first control signal to the output unit; a low potential line to which a predetermined reference potential is applied; a first connection switching unit that switches whether or not to connect the control line and the low potential line, in accordance with a second control signal; and a cutoff unit that is provided in series with the first connection switching unit between the control line and the low potential line and cuts off the control line and the low potential line based on a potential of the low potential line.

8 Claims, 13 Drawing Sheets

DRIVER CIRCUIT AND SEMICONDUCTOR DEVICE

The contents of the following Japanese patent application(s) are incorporated herein by reference:
NO. 2019-163026 filed on Sep. 6, 2019.

BACKGROUND

1. Technical Field

The present invention relates to a driver circuit and a semiconductor device.

2. Related Art

In the related art, known is a driver circuit that drives a power semiconductor such as a MOSFET, an IGBT (insulated gate bipolar transistor) and the like (for example, refer to Patent Documents 1 and 2). The driver circuit comprises a low potential terminal that is connected to a low potential such as a ground potential.

Patent Document 1: Japanese Patent Application Publication No. 2009-10477
Patent Document 2: Japanese Patent Application Publication No. H08-83909

SUMMARY

It is preferably to protect the driver circuit even when a potential that is applied to the low potential terminal varies.

In order to solve the above problem, a first aspect of the present invention provides a driver circuit that controls an output unit that switches whether or not to supply a current to an output line, in accordance with a potential difference between a first control signal to be input and a voltage of the output line. The driver circuit may comprise a control line that transmits the first control signal to the output unit. The driver circuit may comprise a low potential line to which a predetermined reference potential is applied. The driver circuit may comprise a first connection switching unit that switches whether or not to connect the control line and the low potential line, in accordance with a second control signal. The driver circuit may comprise a cutoff unit that is provided in series with the first connection switching unit between the control line and the low potential line and cuts off the control line and the low potential line based on a potential of the low potential line.

The cutoff unit may cut off the control line and the low potential line, regardless of a value of the second control signal, when the potential of the low potential line becomes higher than a first threshold potential.

The driver circuit may comprise a high potential line to which a potential higher than the first threshold potential is applied. The driver circuit may comprise a pre-stage control unit that is provided between the high potential line and the low potential line and inputs a potential of any one of the high potential line and the low potential line to the first connection switching unit, as the second control signal. The first connection switching unit may include a MOSFET that becomes on when a potential input from the pre-stage control unit is higher than a second threshold potential.

The pre-stage control unit may include a first inverter that is provided between the high potential line and the low potential line and selects and outputs a potential of any one of the high potential line and the low potential line, in accordance with an input signal. The pre-stage control unit may include a second inverter that is provided between the high potential line and the low potential line, selects a potential of any one of the high potential line and the low potential line in accordance with an output of the first inverter and inputs the selected potential to the MOSFET of the first connection switching unit, as the second control signal. The cutoff unit may cut off the control line and the low potential line when an output of the first inverter is higher than the first threshold potential.

The pre-stage control unit may include a first inverter that is provided between the high potential line and the low potential line and selects and outputs a potential of any one of the high potential line and the low potential line, in accordance with an input signal. The pre-stage control unit may include a second inverter that is provided between the high potential line and the low potential line, selects a potential of any one of the high potential line and the low potential line, in accordance with an output of the first inverter, and inputs the selected potential to the MOSFET of the first connection switching unit, as the second control signal. The pre-stage control unit may include a third inverter that is provided between the high potential line and the low potential line, and selects and inputs a potential of any one of the high potential line and the low potential line to the cutoff unit, in accordance with an output of the second inverter. The cutoff unit may cut off the control line and the low potential line when an output of the third inverter is higher than the first threshold potential.

The pre-stage control unit may include a first inverter that is provided between the high potential line and the low potential line and selects and outputs a potential of any one of the high potential line and the low potential line, in accordance with an input signal. The pre-stage control unit may include a second inverter that is provided between the high potential line and the low potential line, selects a potential of any one of the high potential line and the low potential line, in accordance with an output of the first inverter, and inputs the selected potential to the MOSFET of the first connection switching unit, as the second control signal. The pre-stage control unit may include a third inverter that is provided between the high potential line and the low potential line, and selects and inputs a potential of any one of the high potential line and the low potential line to the cutoff unit, in accordance with an input of the first inverter. The cutoff unit may cut off the control line and the low potential line when an output of the third inverter is higher than the first threshold potential.

The driver circuit may comprise a second connection switching unit that switches whether or not to connect the control line and the output line. The driver circuit may comprise a post-stage control unit that causes the second connection switching unit to connect the control line and the output line when the pre-stage control unit outputs a voltage higher than a predetermined third threshold potential.

The post-stage control unit may be provided between the high potential line and the output line, select a potential of any one of the high potential line and the output line, in accordance with a voltage output from the pre-stage control unit, and input the selected potential to the second connection switching unit.

The pre-stage control unit may include a first inverter that is provided between the high potential line and the low potential line and selects and outputs a potential of any one of the high potential line and the low potential line, in accordance with an input signal. The pre-stage control unit may include a second inverter that is provided between the high potential line and the low potential line, selects a potential of any one of the high potential line and the low potential line, in accordance with an output of the first inverter, and inputs the selected potential to the MOSFET of the first connection switching unit, as the second control signal. The pre-stage control unit may include a third inverter that is provided between the high potential line and the low potential line, and selects and inputs a potential of any one of the high potential line and the low potential line to the cutoff unit, in accordance with an output of the second inverter. The pre-stage control unit may include a fourth inverter that is provided between the high potential line and the low potential line, selects a potential of any one of the high potential line and the low potential line in accordance with an output of the first inverter and inputs the selected potential to the post-stage control unit. The cutoff unit may cut off the control line and the low potential line when an output of the third inverter is higher than the first threshold potential.

The pre-stage control unit may include a first inverter that is provided between the high potential line and the low potential line and selects and outputs a potential of any one of the high potential line and the low potential line, in accordance with an input signal. The pre-stage control unit may include a second inverter that is provided between the high potential line and the low potential line, selects a potential of any one of the high potential line and the low potential line, in accordance with an output of the first inverter, and inputs the selected potential to the MOSFET of the first connection switching unit and the post-stage control unit. The pre-stage control unit may include a third inverter that is provided between the high potential line and the low potential line, and selects and inputs a potential of any one of the high potential line and the low potential line to the cutoff unit, in accordance with an output of the second inverter. The cutoff unit may cut off the control line and the low potential line when an output of the third inverter is higher than the first threshold potential.

The first connection switching unit may include an n-channel MOSFET arranged between the control line and the low potential line. The cutoff unit may include a p-channel MOSFET arranged between the n-channel MOSFET and the low potential line.

A second aspect of the present invention provides a semiconductor device that comprises an output line, an output unit that switches whether or not to supply a current to the output line in accordance with a potential difference between a first control signal to be input and a voltage of the output line, and the driver circuit of the first aspect.

The summary of the present invention does not necessarily describe all necessary features of the present invention. The present invention may also be a sub-combination of the features described above.

DESCRIPTION OF EXEMPLARY EMBODIMENTS

Hereinafter, the present invention will be described through embodiments of the invention. However, the following embodiments do not limit the invention defined in the claims. Also, all combinations of features described in the embodiments are not necessarily essential to solutions of the invention.

Figure 1:
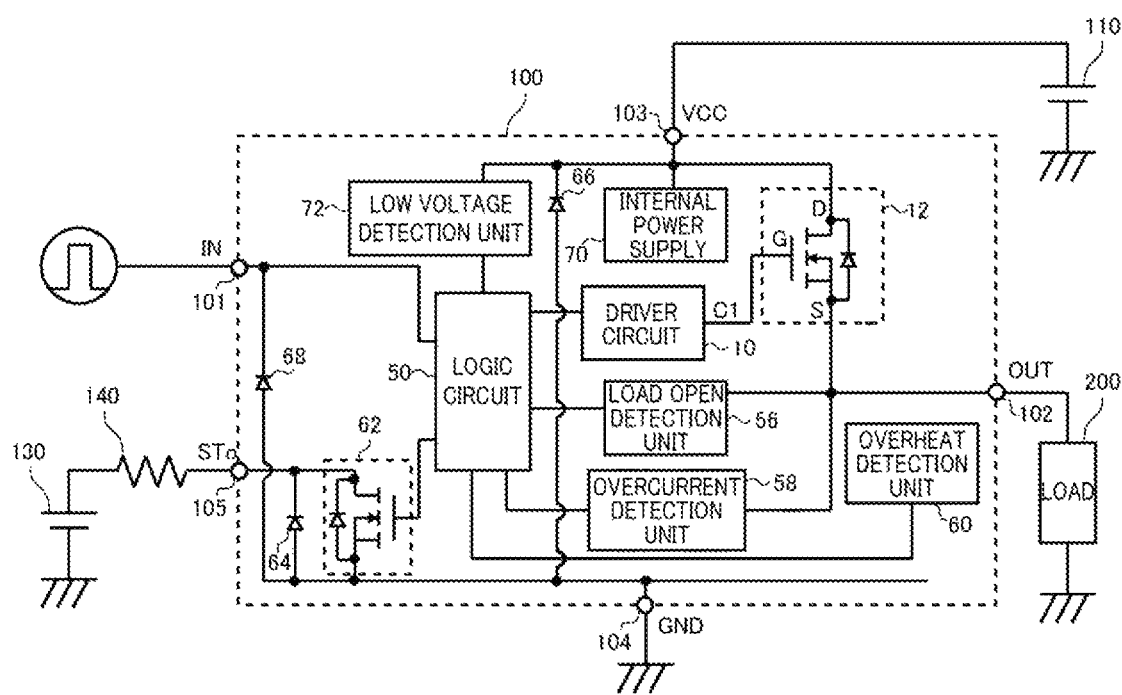
FIG. 1 shows an example of a semiconductor device 100 in accordance with one embodiment of the present invention.

FIG. 1 shows an example of a semiconductor device 100 in accordance with one embodiment of the present invention. The semiconductor device 100 of the present example is a semiconductor chip comprising an input terminal 101, an output terminal 102, a high potential terminal 103 and a low potential terminal 104. The semiconductor device 100 may further comprise a state terminal 105.

The semiconductor device 100 operates in accordance with an input signal IN that is input to the input terminal 101, thereby supplying power to a load 200 connected to the output terminal 102. The input signal IN of the present example may be a signal indicating, with a binary logical value, a case where power is supplied to the load 200 and a case where power is not supplied.

A predetermined high potential VCC is applied to the high potential terminal 103. The high potential terminal 103 of the present example is connected to a power supply 110 that generates the high potential VCC. The low potential terminal 104 is applied with a low potential lower than the high potential VCC. The low potential of the present example is a ground potential GND.

The semiconductor device 100 outputs a state signal STo indicative of an internal state of the semiconductor device 100 from the state terminal 105. The state signal STo may be a signal indicating that an abnormality such as overcurrent is detected. The state terminal 105 may be connected to a pull-up power supply 130 via an external resistor 140. The state signal STo is input to an external processing device. The processing device may control the semiconductor device 100 or another semiconductor device 100, in accordance with the state signal STo. For example, the processing device is connected to a plurality of semiconductor devices 100, and stops power supplying from the plurality of semiconductor devices 100 when an abnormality is detected in any one of the plurality of semiconductor device 100.

The semiconductor device 100 comprises a driver circuit 10 and an output unit 12. The output unit 12 is connected to the load 200 via the output terminal 102, and supplies power to the load 200. The output unit 12 may be a switching device such as an IGBT, a power MOSFET or the like. The output unit 12 has a control terminal G (for example, gate terminal), and source terminal S and a drain terminal D. The drain terminal D of the present example is connected to the high potential terminal 103, and the source terminal S is connected to the output terminal 102. The output unit 12 switches whether or not to apply the high potential VCC to the load 200, in accordance with a potential difference between a first control signal C1 that is input to the control terminal G and the source terminal S.

The driver circuit 10 inputs to the control terminal G of the output unit 12 the first control signal C1 corresponding to an input signal IN that is input to the input terminal 101. The driver circuit 10 is input with a signal having a potential of which a basis is a low potential GND. The driver circuit 10 functions as a level shift circuit that level-shifts a signal based on the low potential GND to the first control signal C1 based on an output potential OUT of the output unit 12. The output potential OUT may also be a potential of the source terminal S of the output unit 12.

The semiconductor device 100 of the present example comprises a logic circuit 50. The logic circuit 50 inputs to the driver circuit 10 a control signal having a logical value pattern corresponding to the input signal IN. The control signal that is output by the logic circuit 50 becomes a potential corresponding to the low potential GND for a logical value L, and becomes a potential corresponding to the high potential VCC for a logical value H. The potential corresponding to the low potential GND may be substantially equal to the low potential GND. The potential corresponding to the high potential VCC may be substantially equal to the high potential VCC.

The logic circuit 50 of the present example controls the driver circuit 10, based on an internal state of the semiconductor device 100. The internal state of the semiconductor device 100 may be a state indicated by at least one parameter of a voltage value, a current value and a resistance value at a predetermined node and a temperature at a predetermined place. The semiconductor device 100 of the present example comprises at least one of a low voltage detection unit 72, a load open detection unit 56, an overcurrent detection unit 58 and an overheat detection unit 60 each of which monitors the internal state of the semiconductor device 100.

The low voltage detection unit 72 detects a voltage value of the high potential VCC of the high potential terminal 103. The low voltage detection unit 72 notifies the logic circuit 50 of an abnormal state when a voltage value of the high potential VCC is below a predetermined reference value.

The load open detection unit 56 detects whether or not the load 200 is connected to the output terminal 102. The load open detection unit 56 may detect whether or not the output terminal 102 is opened, based on an output resistance when a predetermined voltage or current is output from the output terminal 102. The load open detection unit 56 notifies the logic circuit 50 of an abnormal state when it is detected that the load 200 is not connected, in order to prevent the output unit 12 from being in an on state in a state where the load 200 is not connected to the output terminal 102.

The overcurrent detection unit 58 detects a current that is output from the output unit 12. The overcurrent detection unit 58 notifies the logic circuit 50 of an abnormal state when an output current value exceeds a predetermined reference value.

The overheat detection unit 60 detects a temperature at one or more places in the semiconductor device 100. The overheat detection unit 60 notifies the logic circuit 50 of an abnormal state when a temperature at any one place exceeds the predetermined reference value.

The logic circuit 50 controls the output unit 12 to an off state, irrespective of a logical value of the input signal IN, when an abnormal state is notified from any one detection unit. The output unit 12 is controlled to the off state in accordance with the internal state of the semiconductor device 100, so that the semiconductor device 100 can be protected.

The semiconductor device 100 of the present example comprises a state signal output unit 62. The logic circuit 50 causes the state signal output unit 62 to output a predetermined logical value when an abnormal state is notified from any one detection unit. The state signal output unit 62 of the present example is a MOSFET that is connected between the state terminal 105 and the low potential terminal 104. When an abnormal state is notified, the logic circuit 50 inputs a predetermined signal to a gate terminal of the MOSFET, thereby controlling the MOSFET to an off state. In this case, the state signal STo that is output from the state terminal 105 becomes a voltage corresponding to the pull-up power supply 130. When an abnormal state is not notified, the logic circuit 50 controls the MOSFET to an on state. In this case, the state signal STo that is output from the state terminal 105 becomes a voltage corresponding to the low potential GND. Thereby, it is possible to notify the external processing device of the internal state of the semiconductor device 100. The logic circuit 50 may control the on and off states of the MOSFET so as to be opposite to the above example.

The semiconductor device 100 may comprise at least one of a diode 64, a diode 66, and a diode 68. The diode 64 has an anode terminal connected to the low potential terminal 104 and a cathode terminal connected to the state terminal 105. When a voltage of a predetermined value or greater is input to the state terminal 105, the diode 64 connects the state terminal 105 to the low potential terminal 104 to protect the semiconductor device 100.

The diode 66 has an anode terminal connected to the low potential terminal 104 and a cathode terminal connected to the high potential terminal 103. When a voltage of a predetermined value or greater is input to the high potential terminal 103, the diode 64 connects the high potential terminal 103 to the low potential terminal 104 to protect the semiconductor device 100.

The diode 68 has an anode terminal connected to the low potential terminal 104 and a cathode terminal connected to the input terminal 101. When a voltage of a predetermined value or greater is input to the input terminal 101, the diode 64 connects the input terminal 101 to the low potential terminal 104 to protect the semiconductor device 100.

The semiconductor device 100 may comprise an internal power supply 70. The internal power supply 70 is connected to the high potential terminal 103. The internal power supply 70 may generate a power supply voltage that is supplied to each circuit of the semiconductor device 100, in accordance with the high potential VCC. For example, the internal power supply 70 supplies the power supply voltage to each detection unit.

Figure 2:
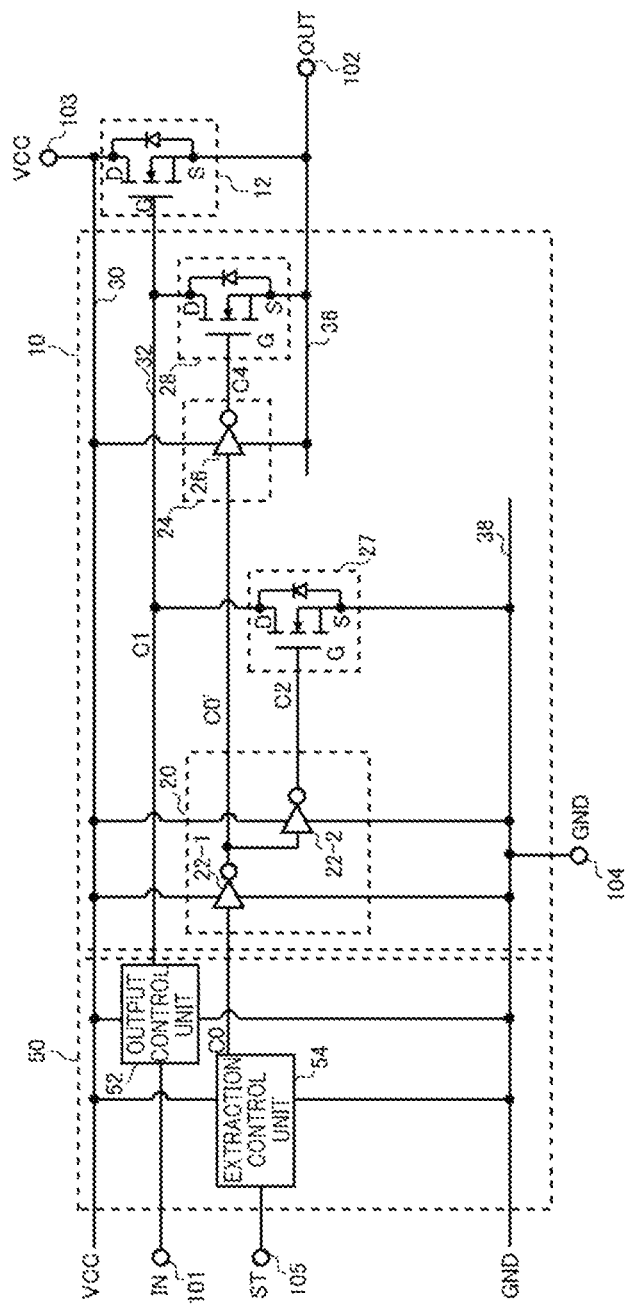
FIG. 2 shows an example of a logic circuit 50, a driver circuit 10 and an output unit 12.

FIG. 2 shows an example of the logic circuit 50, the driver circuit 10 and the output unit 12. The semiconductor device 100 of the present example comprises a high potential line 30 connected to the high potential terminal 103, a low potential line 38 connected to the low potential terminal 104, and an output line 36 connected to the output terminal 102. The output unit 12 of the present example has a drain terminal D connected to the high potential line 30 and a source terminal S connected to the output line 36. The output unit 12 switches whether or not to supply the current to the output line 36, in accordance with a potential difference between the first control signal C1 that is input to the control terminal G and a voltage of the output line 36.

The logic circuit 50 of the present example includes an output control unit 52 and an extraction control unit 54. The output control unit 52 is input with an input signal IN indicative of a timing at which the output unit 12 is shifted to an on or off state. The output control unit 52 of the present example outputs the first control signal C1 that indicates a logical value H when controlling the output unit 12 to an on state and indicates a logical value L when controlling the output unit 12 to an off state. The first control signal C1 has a potential capable of causing the output unit 12 to perform a switching operation. For example, the first control signal C1 is a signal that indicates a potential corresponding to the high potential VCC for the logical value H and indicates a potential corresponding to an output potential OUT for the logical value L. The output control unit 52 may include a charge pump that generates the first control signal C1. An output end of the output control unit 52 and the control terminal G of the output unit 12 are connected by a control line 32. The control line 32 transmits the first control signal C1 to the control terminal G of the output unit 12.

The extraction control unit 54 is input with the state signal ST from a state signal generating unit (not shown) of the logic circuit 50. The state signal generating unit (not shown) of the logic circuit 50 generates the state signal ST indicating that an abnormal state is notified from any one detection unit shown in FIG. 1. A logical value of the state signal ST may be the same as the logical value of the state signal STo described in FIG. 1.

When an abnormal state is detected, the extraction control unit 54 connects the control line 32 and the low potential line 38, thereby extracting charges of the control terminal G of the output unit 12 to the low potential line 38 to control the output unit 12 to an off state, irrespective of a logical value of the first control signal C1. Thereby, the semiconductor device 100 and the peripheral circuit can be protected. The extraction control unit 54 disconnects the control line 32 and the low potential line 38 when an abnormal state is not detected.

The extraction control unit 54 of the present example outputs a control signal C0 that indicates a first logical value when connecting the control line 32 and the low potential line 38 and indicates a second logical value when disconnecting the control line 32 and the low potential line 38. The control signal C0 is a signal that indicates a potential corresponding to the high potential VCC for one logical value and indicates a potential corresponding to the low potential GND for the other logical value.

The driver circuit 10 includes a first connection switching unit 27. The first connection switching unit 27 switches whether or not to connect the control line 32 and the low potential line 38, in accordance with a second control signal C2 that is input. The first connection switching unit 27 of the present example is a MOSFET of which a drain terminal D is connected to the control line 32, a source terminal S is connected to the low potential line 38 and a gate terminal G is input with the second control signal C2. The MOSFET of the first connection switching unit 27 of the present example becomes an on state when a potential input from a pre-stage control unit 20 is higher than a predetermined second threshold potential.

The driver circuit 10 may include a pre-stage control unit 20 that generates the second control signal C2 based on the control signal C0. The pre-stage control unit 20 selects any one of the potential of the high potential line 30 and the potential of the low potential line 38, in accordance with a logical value of the control signal C0, and outputs the same, as the second control signal C2. The pre-stage control unit 20 of the present example includes a first inverter 22-1 to which the control signal C0 is input and a second inverter 22-2 to which an output of the first inverter 22-1 is input and from which the second control signal C2 is output. Each of the first inverter 22-1 and the second inverter 22-2 selects and outputs the potential of the low potential line 38 when an input signal is a logical value H and selects and outputs the potential of the high potential line 30 when the input signal is a logical value L.

The first inverter 22-1 is provided between the high potential line 30 and the low potential line 38 and selects and outputs a potential of any one of the high potential line 30 and the low potential line 38, in accordance with the control signal C0. The second inverter 22-2 is provided between the high potential line 30 and the low potential line 38, and selects a potential of any one of the high potential line 30 and the low potential line 38, in accordance with an output of the first inverter 22-1, and inputs the selected potential to the MOSFET of the first connection switching unit 27, as the second control signal C2.

When an abnormal state is detected, the control line 32 and the low potential line 38 are connected, in accordance with the control signal C0, so that the output unit 12 can be controlled to an off state, irrespective of a value of the first control signal C1. Thereby, the semiconductor device 100 and the peripheral circuit can be protected. When an abnormal state is not detected, the control line 32 and the low potential line 38 are disconnected, in accordance with the control signal C0, so that the output unit 12 can be operated in accordance with the first control signal C1.

The driver circuit 10 may further comprise a post-stage control unit 24 and a second connection switching unit 28. The second connection switching unit 28 switches whether or not to connect the control line 32 and the output line 36, in accordance with a fourth control signal C4 that is input. The second connection switching unit 28 of the present example is a MOSFET of which a drain terminal D is connected to the control line 32, a source terminal S is connected to the output line 36 and a gate terminal G is input with the fourth control signal C4.

The post-stage control unit 24 generates the fourth control signal C4, based on a control signal C0' that is output by the pre-stage control unit 20. The control signal C0' of the present example is a signal that is output by the first inverter 22-1. The post-stage control unit 24 selects a potential of any one of the high potential line 30 and the output line 36, in accordance with a voltage that is output by the pre-stage control unit 20, and inputs the selected potential to the second connection switching unit 28. The post-stage control unit 24 may include a post-stage inverter 26 to which the control signal C0' is input and from which the fourth control signal C4 is output. The post-stage inverter 26 selects and outputs the potential of the output line 36 when an input signal is a logical value H and selects and outputs the potential of the high potential line 30 when the input signal is a logical value L.

When an abnormal state is detected, the second connection switching unit 28 is controlled to an on state by the control signal C0, thereby connecting the control line 32 and the output line 36. Thereby, the output unit 12 can be controlled to an off state, irrespective of a value of the first control signal C1. Thereby, the semiconductor device 100 and the peripheral circuit can be protected. When an abnormal state is not detected, the control line 32 and the output line 36 are disconnected, in accordance with the control signal C0, so that the output unit 12 can be operated in accordance with the first control signal C1.

The potential of the low potential GND may rise due to factors such as the low potential terminal 104 being opened. When an open state is formed between the low potential terminal 104 and the ground potential, the potential of the low potential terminal 104 may be pulled up by an internal circuit and the like of the semiconductor device 100. When the potential of the low potential GND rises, both the high potential VCC and the low potential GND that are applied to the pre-stage control unit 20 may become a potential corresponding to a logical value H.

In this case, a signal that is output from each inverter 22 of the pre-stage control unit 20 becomes a logical value H, irrespective of a logical value of the control signal C0 that is input from the extraction control unit 54. For this reason, the first connection switching unit 27 becomes on all the time. Therefore, the potential of the control line 32 becomes substantially the same as the low potential line 38. Since the potential of the low potential line 38 corresponds to the logical value H, the output unit 12 becomes on all the time, irrespective of a logical value of the first control signal C1. For this reason, when the potential of the low potential line 38 rises, the semiconductor device 100 may not be appropriately protected.

Figure 3:
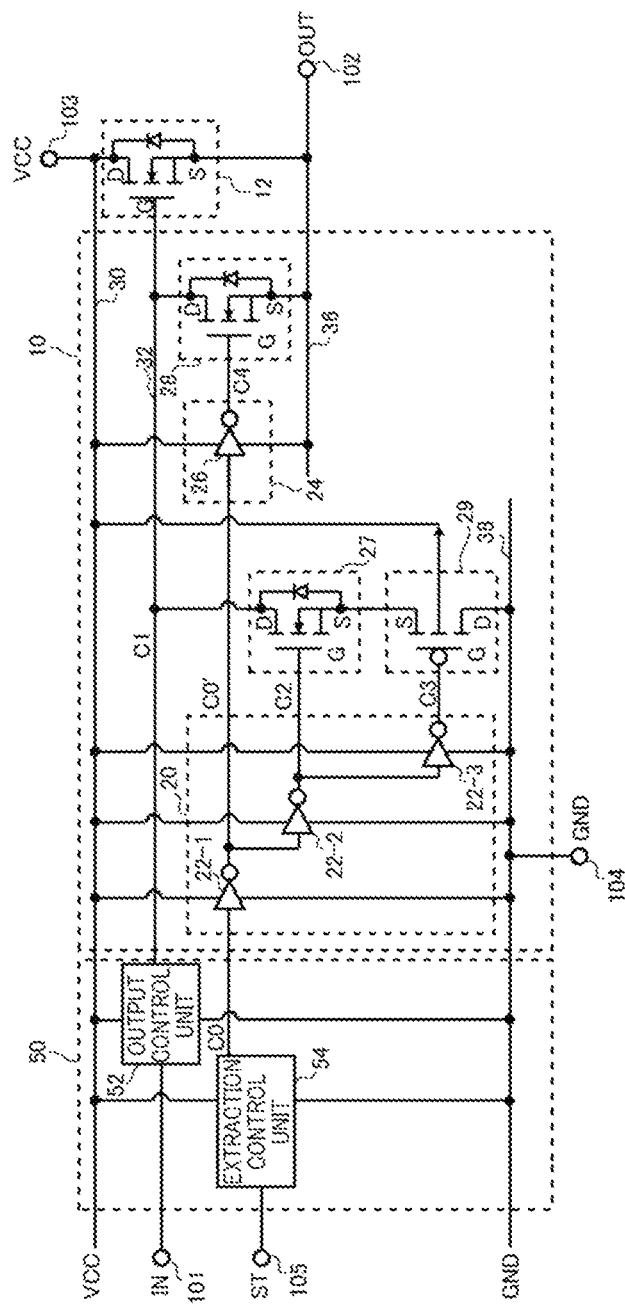
FIG. 3 shows a configuration example of the driver circuit 10 in accordance with one embodiment of the present invention.

FIG. 3 shows a configuration example of the driver circuit 10 in accordance with one embodiment of the present invention. The logic circuit 50 and the output unit 12 in FIG. 3 are the same as the logic circuit 50 and the output unit 12 shown in FIG. 2.

The driver circuit 10 of the present example further comprises a cutoff unit 29, in addition to the configuration of the driver circuit 10 shown in FIG. 2. The cutoff unit 29 is provided in series with the first connection switching unit 27 between the control line 32 and the low potential line 38, and cuts off the control line 32 and the low potential line 38 based on a potential of the low potential line 38. The cutoff unit 29 of the present example is a MOSFET of which a source terminal S is connected to the drain terminal D of the first connection switching unit 27, the drain terminal D is connected to the low potential line 38 and a gate terminal G is input with a third control signal C3. A back gate of the cutoff unit 29 may be connected to the high potential line 30. The third control signal C3 is a signal that cuts off the control line 32 and the low potential line 38, regardless of a value of the second control signal C2, when the potential of the low potential line 38 becomes higher than a first threshold potential. The first threshold potential may be a threshold potential of the MOSFET of the cutoff unit 29. Further, the high potential VCC that is applied to the high potential line 30 is higher than the first threshold potential. Also, a reference potential GND that is applied to the low potential line 38 is normally lower than the first threshold potential.

According to the present example, when the potential of the low potential line 38 rises, the control line 32 and the low potential line 38 can be disconnected, irrespective of a state of the first connection switching unit 27. For this reason, when the potential of the low potential line 38 rises, it is possible to prevent a situation where the potential of the control line 32 corresponds to the logical value H all the time. When the potential of the low potential line 38 is lower than the first threshold potential, the control line 32 and the low potential line 38 can be connected or disconnected, in accordance with the control signal C0, so that it is possible to protect the semiconductor device 100 in accordance with the control signal C0.

The pre-stage control unit 20 of the present example further includes a third inverter 22-3, in addition to the configuration of the pre-stage control unit 20 shown in FIG. 2. The third inverter 22-3 is input with an output (i.e., the second control signal C2) of the second inverter 22-2, and outputs the third control signal C3 to the cutoff unit 29. The third inverter 22-3 is provided between the high potential line 30 and the low potential line 38, selects a potential of any one of the high potential line 30 and the low potential line 38, in accordance with an output of the second inverter 22-2, and inputs the selected potential to the cutoff unit 29.

The third inverter 22-3 of the present example selects and outputs the potential of the low potential line 38 when an input signal is a logical value H and selects and outputs the potential of the high potential line 30 when the input signal is a logical value L. The cutoff unit 29 cuts off the control line 32 and the low potential line 38 when an output of the third inverter 22-3 is higher than the first threshold potential. Thereby, when the potential of the low potential line 38 corresponds to the logical value H, the third inverter 22-3 sets the cutoff unit 29 to an off state, and when the potential of the low potential line 38 corresponds to the logical value L, the third inverter 22-3 can set an on or off state of the cutoff unit 29 to an on or off state of the first connection switching unit 27.

In the example of FIG. 3, the first connection switching unit 27 has an n-channel MOSFET, and the cutoff unit 29 has a p-channel MOSFET. However, the conductivity type of the channel of each MOSFET is not limited thereto.

Figure 4:
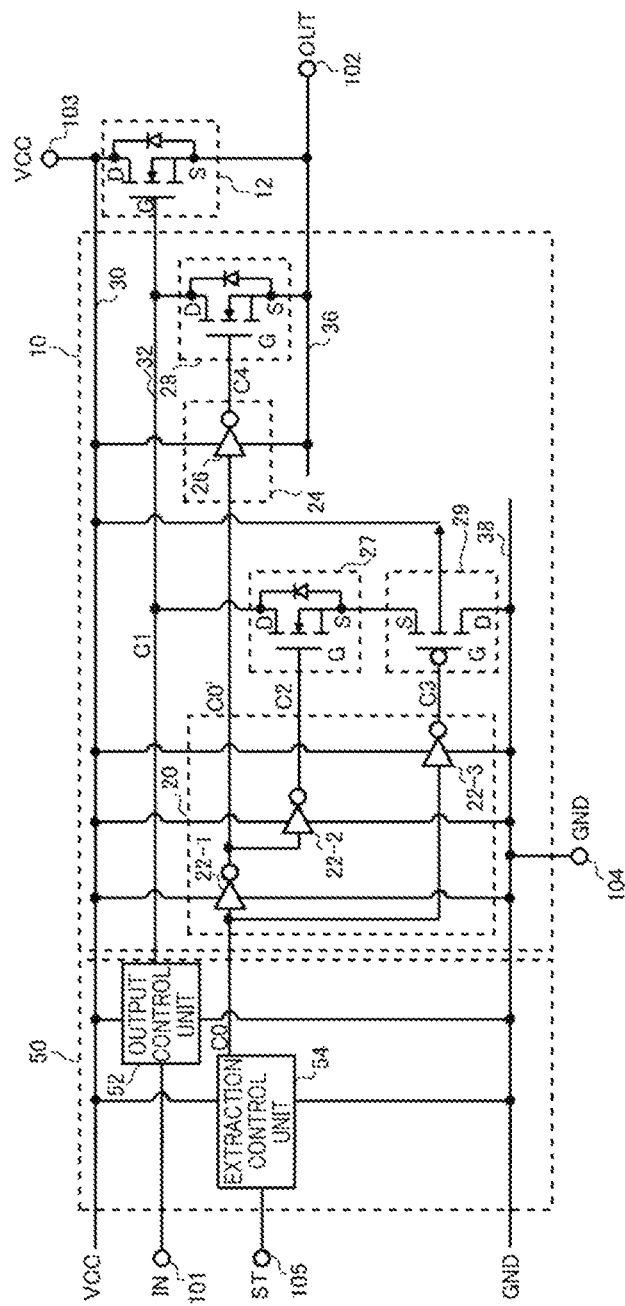
FIG. 4 shows another configuration example of a pre-stage control unit 20.

FIG. 4 shows another configuration example of the pre-stage control unit 20. The pre-stage control unit 20 of the present example is different from the example of FIG. 3, in that the control signal C0 input to the first inverter 22-1 is also input to the third inverter 22-3. The other structure is the same as the pre-stage control unit 20 of FIG. 3.

The third inverter 22-3 selects a potential of any one of the high potential line 30 and the low potential line 38, in accordance with the control signal C0, and inputs the selected potential to the cutoff unit 29. Even with the configuration, when the potential of the low potential line 38 becomes higher than the first threshold potential, the cutoff unit 29 can be cut off. Also, when the potential of the low potential line 38 is lower than the first threshold potential, the on or off state of the cutoff unit 29 can be matched with the on or off state of the first connection switching unit 27.

Figure 5:
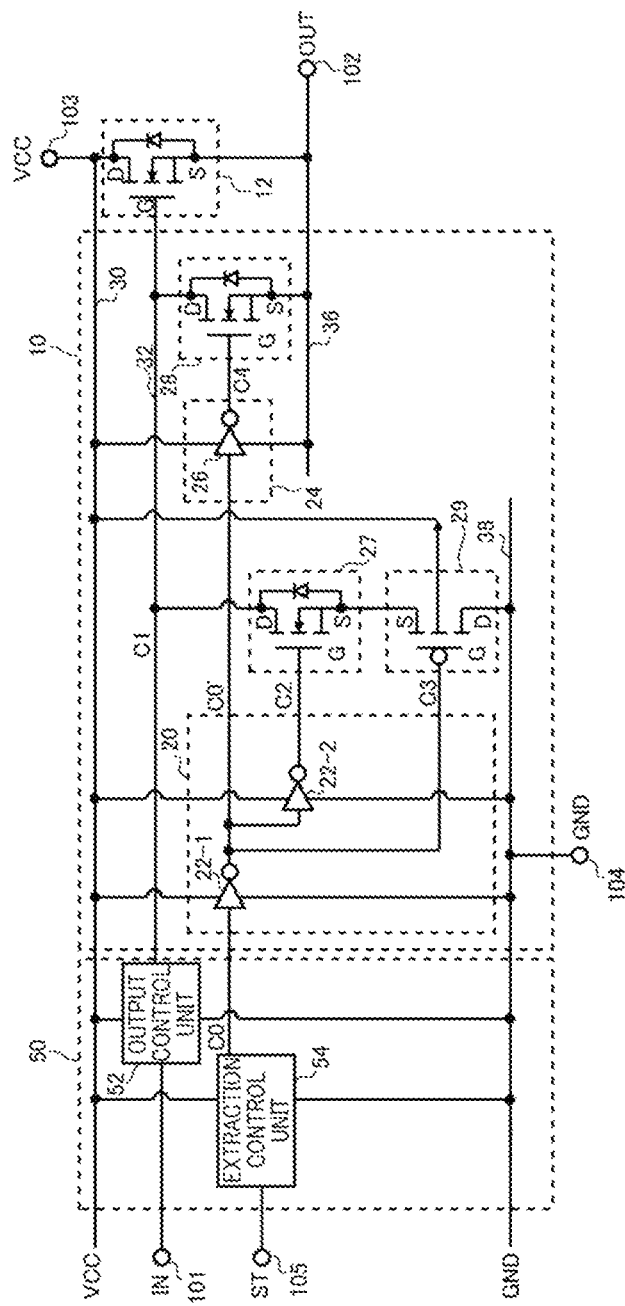
FIG. 5 shows another configuration example of the pre-stage control unit 20.

FIG. 5 shows another configuration example of the pre-stage control unit 20. The pre-stage control unit 20 of the present example is not provided with the third inverter 22-3. The cutoff unit 29 of the present example is input with an output of the first inverter 22-1. The other structure is the same as the pre-stage control unit 20 shown in FIG. 3.

The cutoff unit 29 cuts off the control line 32 and the low potential line 38 when an output of the first inverter 22-1 is higher than the first threshold potential. Even with the configuration, when the potential of the low potential line 38 becomes higher than the first threshold potential, the cutoff unit 29 can be cut off. Also, when the potential of the low potential line 38 is lower than the first threshold potential, the on or off state of the cutoff unit 29 can be matched with the on or off state of the first connection switching unit 27.

Figure 6:
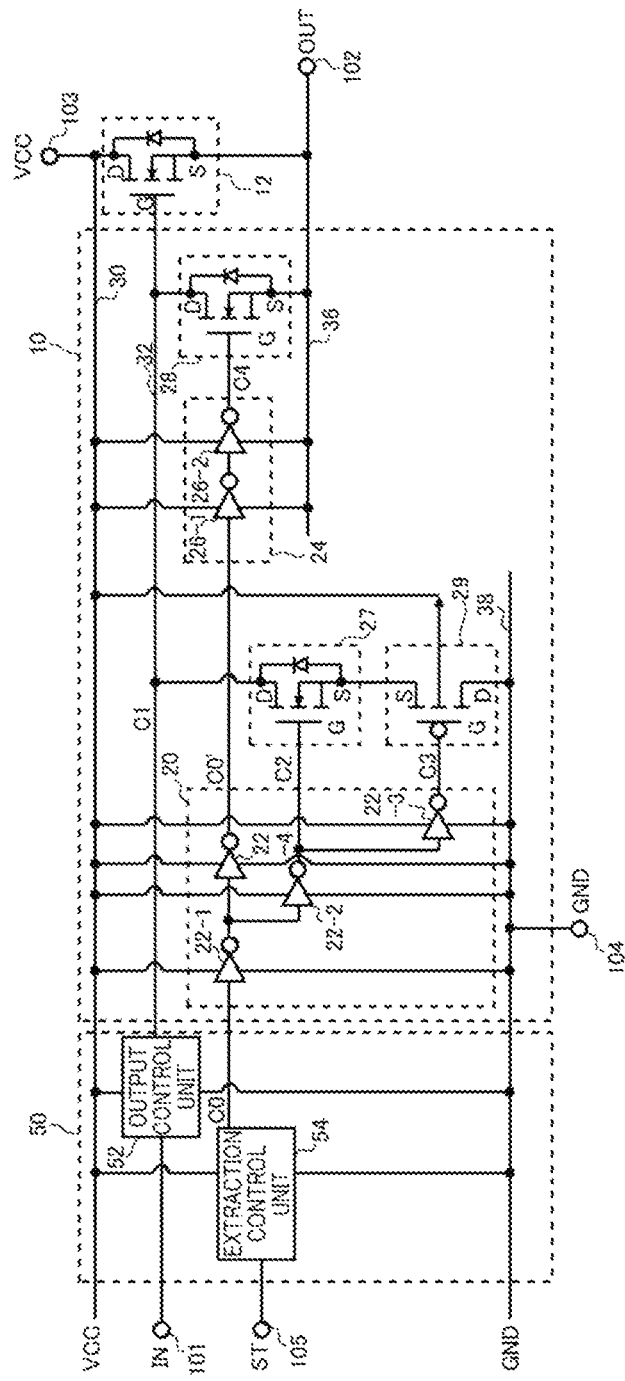
FIG. 6 shows another configuration example of the pre-stage control unit 20 and a post-stage control unit 24.

FIG. 6 shows another configuration example of the pre-stage control unit 20 and the post-stage control unit 24. The post-stage control unit 24 of the present example causes the second connection switching unit 28 to connect the control line 32 and the output line 36 when the pre-stage control unit 20 outputs a voltage higher than a predetermined third threshold potential. The third threshold potential of the present example is a threshold potential of the post-stage inverter 26 provided in the post-stage control unit 24. Also, when the pre-stage control unit 20 outputs a voltage lower than the third threshold potential, the post-stage control unit 24 causes the second connection switching unit 28 to disconnect the control line 32 and the output line 36.

The post-stage control unit 24 of the present example has the post-stage inverters 26 of an even number of stages connected in series. In the example of FIG. 6, the two post-stage inverters 26 are connected in series. Each of the post-stage inverters 26 is arranged between the high potential line 30 and the output line 36. The post-stage inverter 26 selects and outputs the potential of the high potential line 30 when an input voltage is higher than the third threshold potential, and selects and outputs the potential of the output line 36 when an input voltage is lower than the third threshold potential.

In the example of FIG. 2, when the pre-stage control unit 20 outputs a voltage lower than the third threshold potential, the post-stage control unit 24 controls the second connection switching unit 28 to an on state to connect the control line 32 and the output line 36. However, as described above, when the potential of the low potential line 38 rises, the control signal C0' that is input to the post-stage control unit 24 becomes a logical value H, regardless of a value of the control signal C0. In this case, in the example of FIG. 2, the second connection switching unit 28 becomes off all the time, so that the semiconductor device 100 may not be protected as appropriate.

In contrast, the post-stage control unit 24 of the present example controls the second connection switching unit 28 to an on state when a logical value H is input. For this reason, when the potential of the low potential line 38 rises to be a potential corresponding to the logical value H, the second connection switching unit 28 is controlled to an on state. Thereby, the driver circuit 10 can control the output unit 12 to an off state not only when an abnormal state is detected but also when the potential of the low potential line 38 rises. For this reason, the semiconductor device 100 can be protected as appropriate.

In the meantime, a circuit disclosed in Patent Document 1 is provided with a potential difference generating circuit between an output terminal and a ground terminal. However, when an inductive component or the like is connected to a load and a potential of the load is deflected negatively, the current flows from the ground terminal toward the output terminal and a ground potential of a peripheral circuit varies. Also, since a circuit disclosed in Patent Document 2 is provided with a plurality of ground terminals, the number of terminals of a chip increases. According to the driver circuit 10 of the present example, it is possible to protect the semiconductor device 100 by a simple configuration.

The pre-stage control unit 20 of the present example further includes a fourth inverter 22-4, in addition to the structure shown in FIGS. 3 to 5. The structure except the fourth inverter 22-4 is the same as the pre-stage control unit 20 in any one aspect described in FIGS. 3 to 5. FIG. 6 shows a configuration where the fourth inverter 22-4 is added to the pre-stage control unit 20 shown in FIG. 3.

The fourth inverter 22-4 is provided between the high potential line 30 and the low potential line 38, selects a potential of any one of the high potential line 30 and the low potential line 38, in accordance with an output of the first inverter 22-1, and inputs the selected potential to the post-stage control unit 24. The fourth inverter 22-4 selects and outputs the potential of the low potential line 38 when the first inverter 22-1 outputs a logical value H, and selects and outputs the potential of the high potential line 30 when the first inverter 22-1 outputs a logical value L.

The extraction control unit 54 of the present example outputs the control signal C0 of a logical value H when an abnormal state is detected and the output unit 12 should be thus controlled to an off state, and outputs the control signal C0 of a logical value L when the output unit 12 should be controlled in accordance with the first control signal C1. In this case, the pre-stage control unit 20 may include the inverters 22 of an even number of stages connected in series between the extraction control unit 54 and the post-stage control unit 24. Also, the post-stage control unit 24 may include the post-stage inverters 26 of an even number of stages connected in series between the pre-stage control unit 20 and the second connection switching unit 28.

By the above configuration, while operating as a level shift circuit based on the output potential OUT, the post-stage control unit 24 can control the second connection switching unit 28 to an on state when the pre-stage control unit 20 outputs a logical value H. For this reason, even when the potential of the low potential GND rises, the semiconductor device 100 and the like can be protected. In the meantime, in a case where the second connection switching unit 28 is a PMOSFET, the post-stage control unit 24 may include the post-stage inverter 26 of one stage or an odd number of stages.

Also, when it is necessary to control the second connection switching unit 28 to an on state, the pre-stage control unit 20 can output a logical value H. When the potential of the low potential GND rises, an output of the pre-stage control unit 20 is fixed to the logical value H, irrespective of a logical value of the control signal C0. For this reason, in both cases where an abnormal state such as overcurrent is detected in the semiconductor device 100 and where the potential of the low potential GND rises, the second connection switching unit 28 can be controlled to an on state and the output unit 12 can be controlled to an off state. For this reason, the semiconductor device 100 and the like can be protected.

In the meantime, when the extraction control unit 54 may output the control signal C0 of a logical value L when an abnormal state is detected and the output unit 12 should be thus controlled to an off state, and output the control signal C0 of a logical value H when the output unit 12 should be controlled in accordance with the first control signal C1. In this case, preferably, the pre-stage control unit 20 is not provided with the fourth inverter 22-4.

FIGS. 7 to 10 illustrate operation examples of the pre-stage control unit 20 and the post-stage control unit 24 shown in FIG. 6. In FIGS. 7 to 10, the frame lines and reference signs of the pre-stage control unit 20 and the post-stage control unit 24 are omitted, and only each inverter is shown. Also, in the examples of FIGS. 7 to 10, the extraction control unit 54 outputs the control signal C0 of a logical value H when an abnormal state is detected and the output unit 12 should be thus controlled to an off state.

Figure 7:
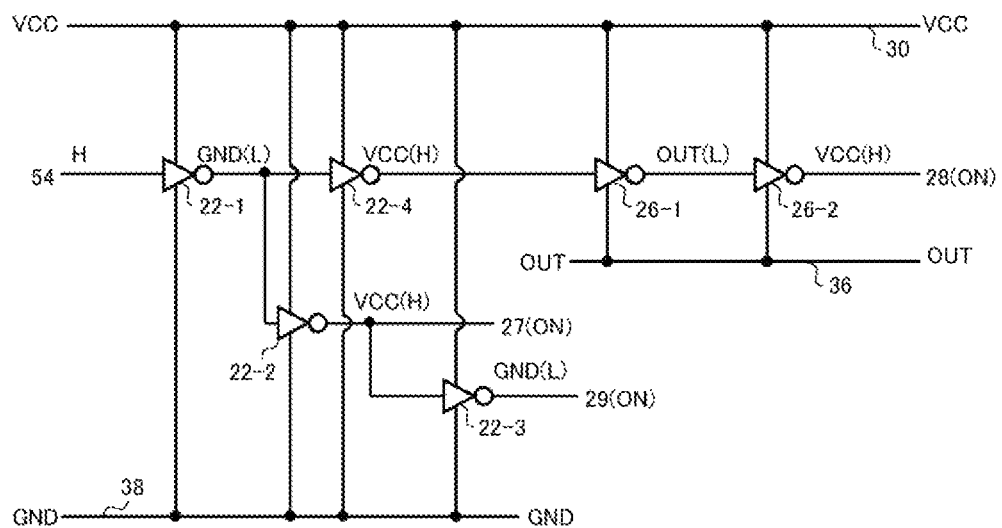
FIG. 7 shows an operation example when a low potential GND is applied to a low potential line 38 and an extraction control unit 54 outputs a logical value H.

FIG. 7 shows an operation example when the low potential GND is applied to the low potential line 38 and the extraction control unit 54 outputs a logical value H. In this case, the first inverter 22-1 selects and outputs the low potential GND (corresponding to a logical value L) of the low potential line 38, in accordance with an input logical value H. The second inverter 22-2 selects and outputs the high potential VCC (corresponding to a logical value H) of the high potential line 30, in accordance with an input logical value L. Thereby, the first connection switching unit 27 is controlled to an on state.

The third inverter 22-3 selects and outputs the low potential GND of the low potential line 38, in accordance with an input logical value H. Thereby, the cutoff unit 29 is controlled to an on state. That is, the control line 32 and the low potential line 38 are connected, so that charges of the gate terminal G of the output unit 12 are extracted.

The fourth inverter 22-4 selects and outputs the high potential VCC (corresponding to a logical value H) of the high potential line 30, in accordance with an input logical value L. The post-stage inverter 26-1 selects and outputs the output potential OUT (corresponding to a logical value L) of the output line 36, in accordance with an input logical value H. The post-stage inverter 26-2 selects and outputs the high potential VCC (corresponding to a logical value H) of the high potential line 30, in accordance with an input logical value L. Thereby, the second connection switching unit 28 is controlled to an on state. That is, the control line 32 and the output line 36 are connected, so that charges of the gate terminal G of the output unit 12 are also extracted to the output line 36. Thereby, the output unit 12 is forcibly controlled to an off state.

Figure 8:
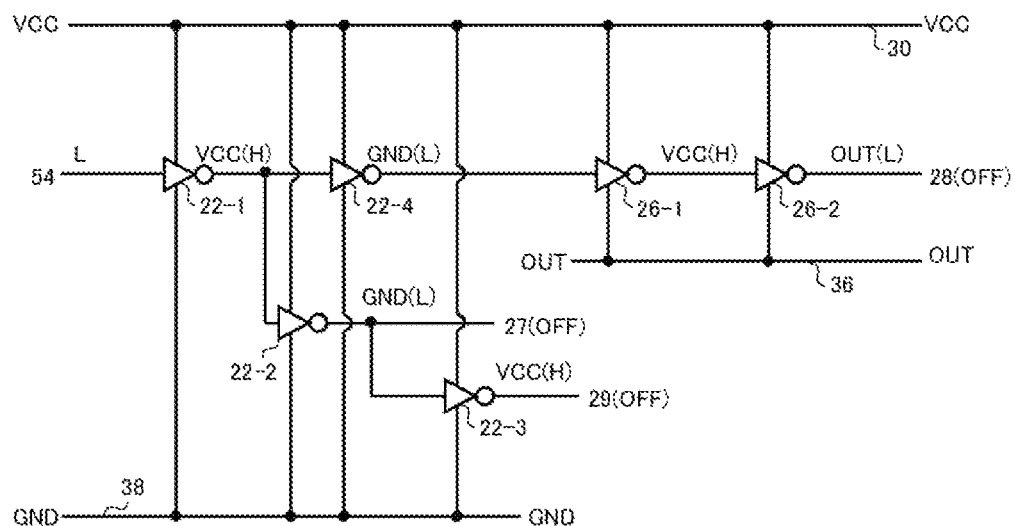
FIG. 8 shows an operation example when the low potential GND is applied to the low potential line 38 and the extraction control unit 54 outputs a logical value L.

FIG. 8 shows an operation example when the low potential GND is applied to the low potential line 38 and the extraction control unit 54 outputs a logical value L. In this case, the first inverter 22-1 selects and outputs the high potential VCC (corresponding to a logical value H) of the high potential line 30, in accordance with n input logical value L. The second inverter 22-2 selects and outputs the low potential GND (corresponding to a logical value L) of the low potential line 38, in accordance with an input logical value H. Thereby, the first connection switching unit 27 is controlled to an off state.

The third inverter 22-3 selects and outputs the high potential VCC of the high potential line 30, in accordance with an input logical value L. Thereby, the cutoff unit 29 is controlled to an off state. That is, the control line 32 and the low potential line 38 are disconnected.

The fourth inverter 22-4 selects and outputs the low potential GND (corresponding to a logical value L) of the low potential line 38, in accordance with an input logical value H. The post-stage inverter 26-1 selects and outputs the high potential VCC (corresponding to a logical value H) of the high potential line 30, in accordance with an input logical value L. The post-stage inverter 26-2 selects and outputs the output potential OUT (corresponding to a logical value L) of the output line 36, in accordance with an input logical value H. Thereby, the second connection switching unit 28 is controlled to an off state. That is, the control line 32 and the output line 36 are disconnected. The output unit 12 operates in accordance with the first control signal C1.

Figure 9:
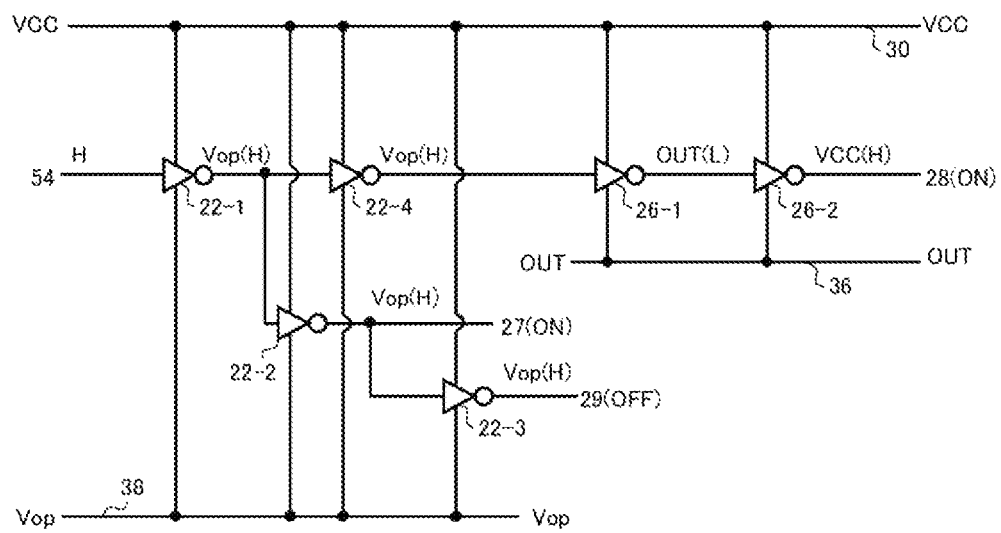
FIG. 9 shows an operation example when an open potential Vop corresponding to a logical value H is applied to the low potential line 38 and the extraction control unit 54 outputs a logical value H.

FIG. 9 shows an operation example when an open potential Vop corresponding to a logical value H is applied to the low potential line 38 and the extraction control unit 54 outputs a logical value H. In this case, an output of each inverter 22 of the pre-stage control unit 20 is fixed to the open potential Vop of the low potential line 38. For this reason, the first connection switching unit 27 is controlled to an on state and the cutoff unit 29 is controlled to an off state. For this reason, the control line 32 and the low potential line 38 can be disconnected, and the potential of the control line 32 can be suppressed from rising in accordance with the open potential Vop of the low potential line 38.

The post-stage inverter 26-1 selects and outputs the output potential OUT (corresponding to a logical value L) of the output line 36, in accordance with an input logical value H. The post-stage inverter 26-2 selects and outputs the high potential VCC (corresponding to a logical value H) of the high potential line 30, in accordance with an input logical value L. Thereby, the second connection switching unit 28 is controlled to an on state. By the above configuration, even when the potential of the low potential line 38 rises to a potential corresponding to the logical value H, the control line 32 and the output line 36 are connected and the control line 32 and the low potential line 38 are disconnected, so that the output unit 12 can be forcibly controlled to an off state.

Figure 10:
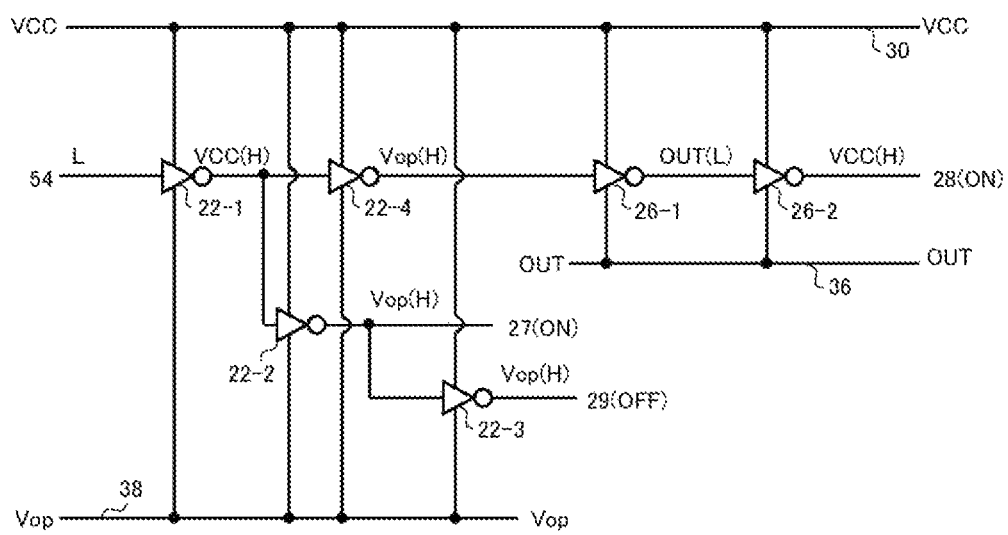
FIG. 10 shows an operation example when an open potential Vop corresponding to a logical value H is applied to the low potential line 38 and the extraction control unit 54 outputs a logical value L.

FIG. 10 shows an operation example when the open potential Vop corresponding to a logical value H is applied to the low potential line 38 and the extraction control unit 54 outputs a logical value L. Also in this case, like the example of FIG. 9, an output of each inverter 22 of the pre-stage control unit 20 is fixed to the logical value H. Therefore, the operations of the first connection switching unit 27, the second connection switching unit 28 and the cutoff unit 29 are the same as the example of FIG. 9. By the above configuration, even when the potential of the low potential line 38 rises to a potential corresponding to the logical value H, the control line 32 and the output line 36 are connected and the control line 32 and the low potential line 38 are disconnected, so that the output unit 12 can be forcibly controlled to an off state.

By the operations described in FIGS. 7 to 10, the output unit 12 can be controlled to an off state in both cases where an abnormal state such as overcurrent is detected in the semiconductor device 100 and where the potential of the low potential GND rises. For this reason, the semiconductor device 100 and the like can be protected.

Figure 11:
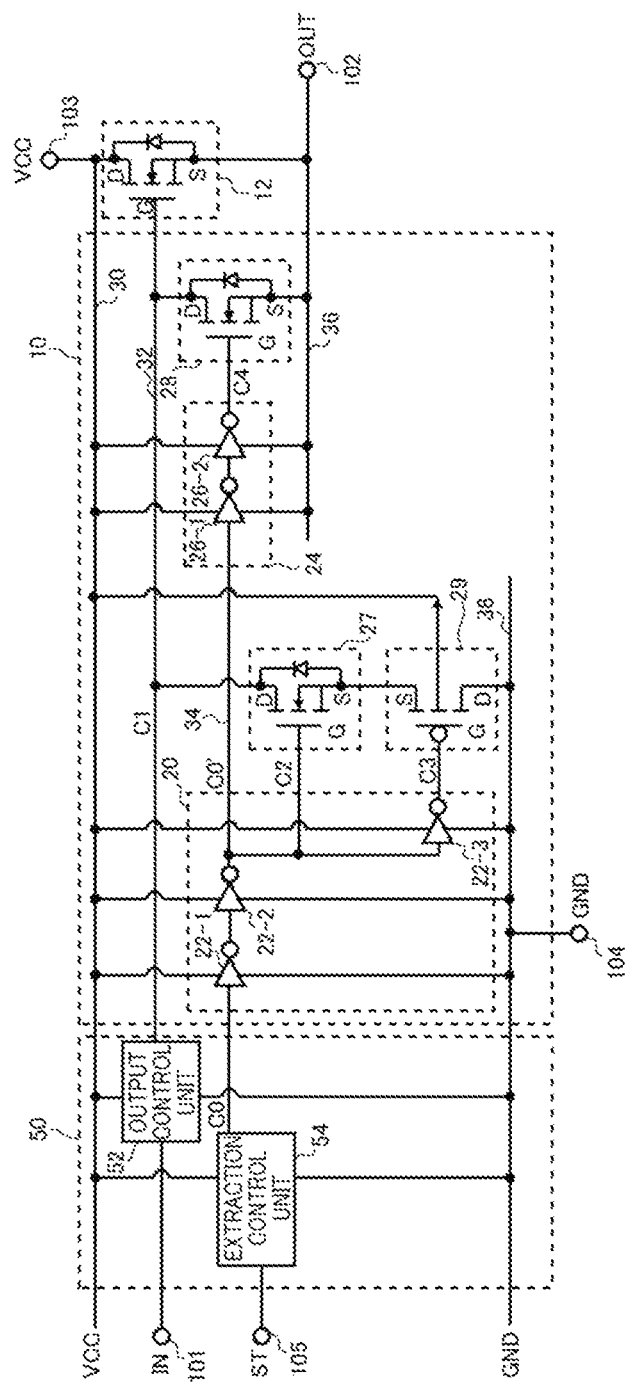
FIG. 11 shows another configuration example of the pre-stage control unit 20.

FIG. 11 shows another configuration example of the pre-stage control unit 20. The pre-stage control unit 20 of the present example includes a first inverter 22-1, a second inverter 22-2 and a third inverter 22-3. The first inverter 22-1 is the same as the first inverter 22-1 described in FIGS. 1 to 10.

The second inverter 22-2 is provided between the high potential line 30 and the low potential line 38, and selects and outputs a potential of any one of the high potential line 30 and the low potential line 38, in accordance with an output of the first inverter 22-1. An output of the second inverter 22-2 is input to both the post-stage inverter 26-1 of the post-stage control unit 24 and the MOSFET of the first connection switching unit 27.

The third inverter 22-3 is provided between the high potential line 30 and the low potential line 38, selects a potential of any one of the high potential line 30 and the low potential line 38, in accordance with an output of the second inverter 22-2, and inputs the selected potential to the cutoff unit 29. The cutoff unit 29 cuts off the control line 32 and the low potential line 38 when an output of the third inverter 22-3 is higher than the first threshold potential.

By the above configuration, the driver circuit 10 operates in the similar manner to the examples described in FIGS. 7 to 10. Also, since the driver circuit 10 of the present example is not provided with the fourth inverter 22-4, a circuit size can be reduced.

Figure 12:
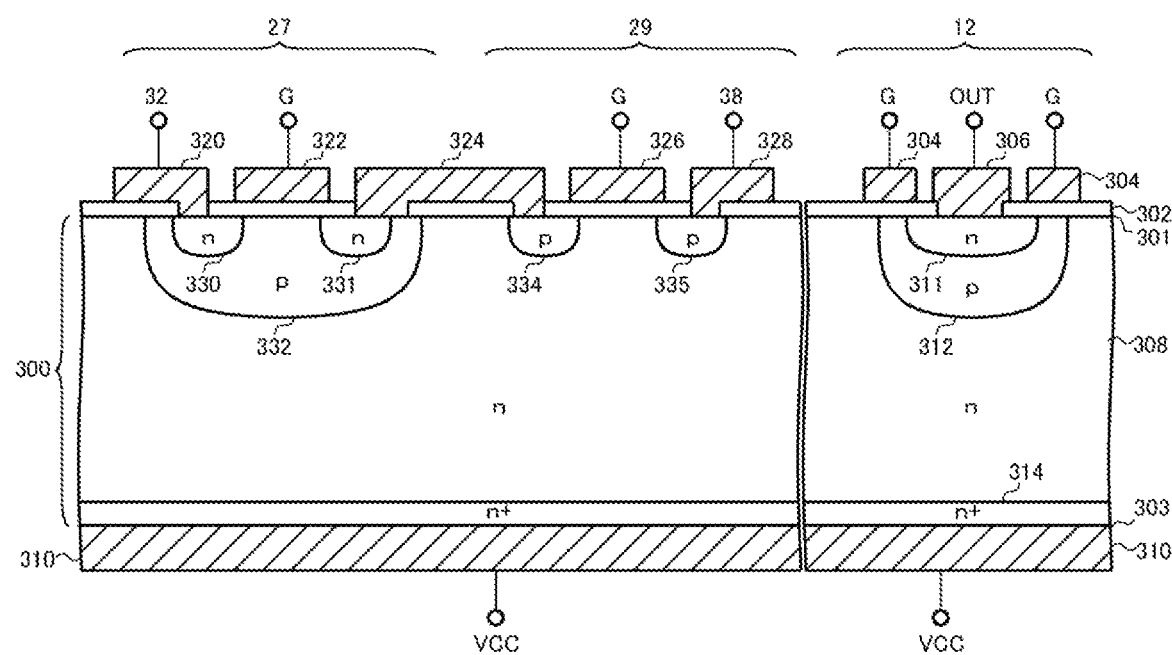
FIG. 12 is a sectional view showing an example of MOSFETs of an output unit 12, a first connection switching unit 27 and a cutoff unit 29.

FIG. 12 is a sectional view showing an example of MOSFETs of the output unit 12, the first connection switching unit 27 and the cutoff unit 29. The MOSFETs of the output unit 12, the first connection switching unit 27 and the cutoff unit 29 of the present example are formed in the same semiconductor substrate 300. The semiconductor substrate 300 is, for example, a silicon substrate but is not limited thereto. The semiconductor substrate 300 of the present example has an n-type drift region 308. An upper surface 301 of the semiconductor substrate 300 is covered with an interlayer dielectric film 302. An entire lower surface 303 of the semiconductor substrate 300 is provided with a drain electrode 310.

The output unit 12 of the present example is a vertical type power MOSFET in which a main current flows between the upper surface 301 and, the lower surface 303 of the semiconductor substrate 300. The upper surface 301 is provided with a p-type base region 312 and an n-type source region 311. The base region 312 is in contact with the upper surface 301. The source region 311 is selectively provided inside of the base region 312 in a region in contact with the upper surface 301. Also, an n+ type drain region 314 is provided between the lower surface 303 and the drift region 308. The drain region 314 is in contact with the drain electrode 310.

The source region 311 is connected to the source electrode 306 via a through-hole provided in the interlayer dielectric film 302. Also, the upper surface 301 is provided with a gate electrode 304 with the interlayer dielectric film 302 being interposed above the base region 312 sandwiched between the drift region 308 and the source region 311. When a predetermined gate voltage is applied to the gate electrode 304, a channel is formed in a surface layer of the base region 312, so that the main current flows between the source region 311 and the drift region 308. The main current passes through the source region 311, the channel, the drift region 308 and the drain region 314, and flows between the source electrode 306 and the drain electrode 310.

The first connection switching unit 27 of the present example is an n-channel MOSFET. Also, the cutoff unit 29 is a p-channel MOSFET. The first connection switching unit 27 is arranged between the control line 32 and the cutoff unit 29. The cutoff unit 29 is arranged between the first connection switching unit 27 and the low potential line 38.

The first connection switching unit 27 includes a drain electrode 320, a gate electrode 322, a wire 324, a drain region 330, a source region 331 and a well region 332. The well region 332 is a p-type region provided in contact with the upper surface 301. The drain region 330 and the source region 331 are n-type regions provided in contact with the upper surface 301 inside of the well region 332. The drain region 330 is connected to the drain electrode 320, and the source region 331 is connected to the wire 324. The well region 332 is also connected to the wire 324.

The well region 332 is arranged between the drain region 330 and the source region 331. Above the well region 332 between the drain region 330 and the source region 331, the gate electrode 322 is provided with the interlayer dielectric film 302 being interposed. When a predetermined gate voltage is applied to the gate electrode 322, a channel is formed in the well region 332, so that the drain region 330 and the source region 331 are connected.

The cutoff unit 29 includes a drain electrode 328, a gate electrode 326, a wire 324, a drain region 335 and a source region 334. The drain region 335 and the source region 334 are p-type regions provided in contact with the upper surface 301 inside of the drift region 308. The drain region 335 is connected to the drain electrode 328, and the source region 334 is connected to the wire 324.

The drift region 308 is arranged between the drain region 335 and the source region 334. Above the drift region 308 between the drain region 335 and the source region 334, the gate electrode 326 is provided with the interlayer dielectric film 302 being interposed. When a predetermined gate voltage is applied to the gate electrode 326, a channel is formed in the drift region 308, so that the drain region 335 and the source region 334 are connected.

By the above configuration, the semiconductor substrate 300 can be provided with the output unit 12, the first connection switching unit 27 and the cutoff unit 29. Also, a leakage current can be suppressed from flowing between the upper surface 301 and the lower surface 303 of the semiconductor substrate 300, in the regions where the first connection switching unit 27 and the cutoff unit 29 are provided.

Figure 13:
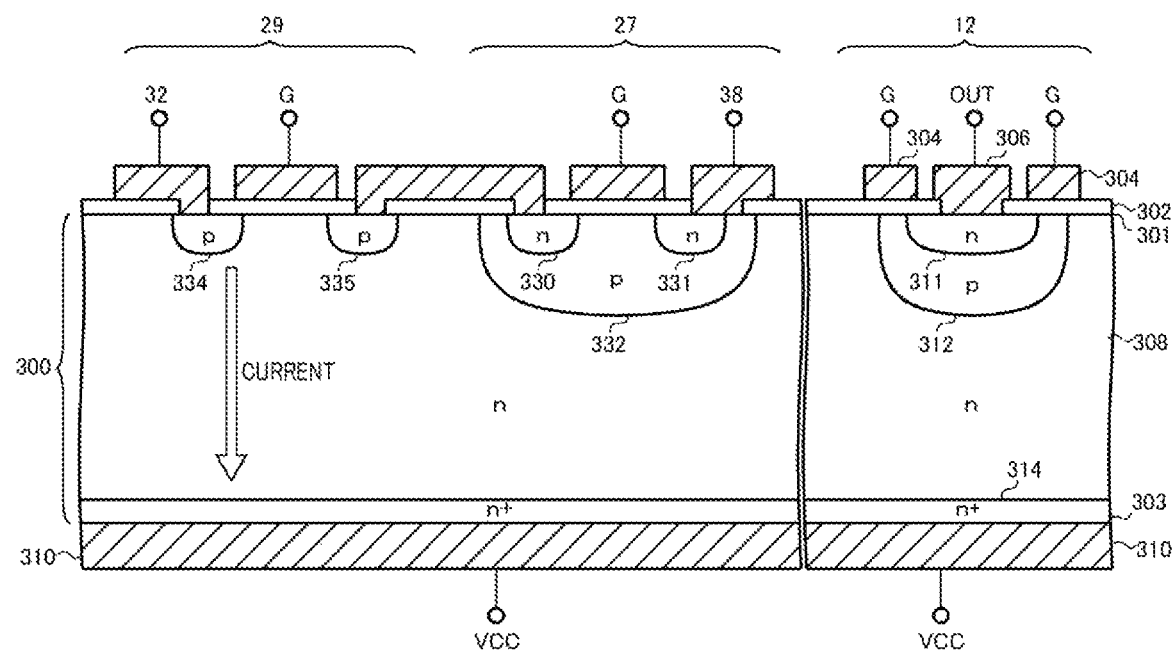
FIG. 13 is a sectional view showing another example of the MOSFETs of the output unit 12, the first connection switching unit 27 and the cutoff unit 29.

FIG. 13 is a sectional view showing another example of the MOSFETs of the output unit 12, the first connection switching unit 27 and the cutoff unit 29. In the present example, the cutoff unit 29 is arranged on the control line 32-side, and the first connection switching unit 27 is arranged on the low potential line 38-side. The well region 332 of the present example is connected to the low potential line 38. The other structure is similar to the example of FIG. 12. In the present example, the control line 32 of a relatively high potential is connected to the source region 334 of the cutoff unit 29. For this reason, the current may flow between the control line 32 and the drain electrode 310 via the source region 334 and the drift region 308. In contrast, in the example shown in FIG. 12, since the first connection switching unit 27 is arranged on the high potential-side, the current can be suppressed from flowing between the upper surface 301 and the lower surface 303 of the semiconductor substrate 300, in the regions where the first connection switching unit 27 and the cutoff unit 29 are provided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 10 driver circuit
12 output unit
20 pre-stage control unit
22 inverter
24 post-stage control unit
26 post-stage inverter
27 first connection switching unit
28 second connection switching unit
29 cutoff unit
30 high potential line
32 control line
36 output line
38 low potential line
50 logic circuit
52 output control unit
54 extraction control unit
56 load open detection unit
58 overcurrent detection unit 60 . . . overheat detection unit
62 state signal output unit
64, 66, 68 diode
70 internal power supply
72 low voltage detection unit
100 semiconductor device
101 input terminal
102 output terminal
103 high potential terminal
104 low potential terminal
105 state terminal
110 power supply
130 . . . pull-up power supply
140 external resistor
200 load
300 semiconductor substrate
301 upper surface
302 . . . interlayer dielectric film
303 lower surface
304 gate electrode
306 source electrode
308 drift region
310 drain electrode
311 source region
312 base region
314 drain region
320 drain electrode
322 gate electrode
324 wire
326 gate electrode
328 drain electrode
330 drain region
331 source region
332 well region
334 source region
335 drain region

What is claimed is:

1. A driver circuit that controls an output unit that switches whether or not to supply a current to an output line, in accordance with a potential difference between a first control signal to be input and a voltage of the output line, the driver circuit comprising:
a control line that transmits the first control signal to the output unit;
a low potential line to which a predetermined reference potential is applied;
a first connection switching unit that switches whether or not to connect the control line and the low potential line, in accordance with a second control signal, one end of the first connection switching unit being connected to the control line;
a cutoff unit that is provided in series with the first connection switching unit between the control line and the low potential line and cuts off the control line and the low potential line based on a potential of the low potential line, wherein the cutoff unit cuts off the control line and the low potential line, regardless of a value of the second control signal, when the potential of the low potential line becomes higher than a first threshold potential;
a high potential line to which a potential higher than the first threshold potential is applied; and
a pre-stage control unit that is provided between the high potential line and the low potential line and inputs a potential of any one of the high potential line and the low potential line to the first connection switching unit, as the second control signal, wherein the first connection switching unit includes a MOSFET that becomes on when a potential input from the pre-stage control unit is higher than a second threshold potential, wherein the pre-stage control unit includes:
a first inverter that is provided between the high potential line and the low potential line and selects and outputs a potential of any one of the high potential line and the low potential line, in accordance with an input signal,
a second inverter that is provided between the high potential line and the low potential line, selects a potential of any one of the high potential line and the low potential line, in accordance with an output of the first inverter, and inputs the selected potential to the MOSFET of the first connection switching unit, as the second control signal, and
a third inverter that is provided between the high potential line and the low potential line, selects a potential of any one of the high potential line and the low potential line, in accordance with an output of the second inverter, and inputs the potential selected by the third inverter to the cutoff unit, and
the cutoff unit cuts off the control line and the low potential line when an output of the third inverter is higher than the first threshold potential.

2. The driver circuit according to claim 1, further comprising:
a second connection switching unit that switches whether or not to connect the control line and the output line; and
a post-stage control unit that causes the second connection switching unit to connect the control line and the output line when the pre-stage control unit outputs a voltage higher than a predetermined third threshold potential.

3. The driver circuit according to claim 2, wherein the post-stage control unit is provided between the high potential line and the output line, selects a potential of any one of the high potential line and the output line, in accordance with a voltage output from the pre-stage control unit, and inputs the selected potential to the second connection switching unit.

4. The driver circuit according to claim 1, wherein the first connection switching unit includes an n-channel MOSFET arranged between the control line and the low potential line, and the cutoff unit includes a p-channel MOSFET arranged between the n-channel MOSFET and the low potential line.

5. A semiconductor device comprising:
an output line;
an output unit that switches whether or not to supply a current to the output line, in accordance with a potential difference between a first control signal to be input and a voltage of the output line, and
the driver circuit according to claim 1.

6. A driver circuit that controls an output unit that switches whether or not to supply a current to an output line, in accordance with a potential difference between a first control signal to be input and a voltage of the output line, the driver circuit comprising:
a control line that transmits the first control signal to the output unit;
a low potential line to which a predetermined reference potential is applied;
a first connection switching unit that switches whether or not to connect the control line and the low potential line, in accordance with a second control signal, one end of the first connection switching unit being connected to the control line;

a cutoff unit that is provided in series with the first connection switching unit between the control line and the low potential line and cuts off the control line and the low potential line based on a potential of the low potential line, wherein the cutoff unit cuts off the control line and the low potential line, regardless of a value of the second control signal, when the potential of the low potential line becomes higher than a first threshold potential;

a high potential line to which a potential higher than the first threshold potential is applied; and a pre-stage control unit that is provided between the high potential line and the low potential line and inputs a potential of any one of the high potential line and the low potential line to the first connection switching unit, as the second control signal, wherein the first connection switching unit includes a MOSFET that becomes on when a potential input from the pre-stage control unit is higher than a second threshold potential, wherein the pre-stage control unit includes:

a first inverter that is provided between the high potential line and the low potential line and selects and outputs a potential of any one of the high potential line and the low potential line, in accordance with an input signal, a second inverter that is provided between the high potential line and the low potential line, selects a potential of any one of the high potential line and the low potential line, in accordance with an output of the first inverter, and inputs the selected potential to the MOSFET of the first connection switching unit, as the second control signal, and a third inverter that is provided between the high potential line and the low potential line, selects a potential of any one of the high potential line and the low potential line, in accordance with an input of the first inverter, and inputs the potential selected by the third inverter to the cutoff unit, and the cutoff unit cuts off the control line and the low potential line when an output of the third inverter is higher than the first threshold potential.

7. A driver circuit that controls an output unit that switches whether or not to supply a current to an output line, in accordance with a potential difference between a first control signal to be input and a voltage of the output line, the driver circuit comprising:

a control line that transmits the first control signal to the output unit;

a low potential line to which a predetermined reference potential is applied;

a first connection switching unit that switches whether or not to connect the control line and the low potential line, in accordance with a second control signal, one end of the first connection switching unit being connected to the control line;

a cutoff unit that is provided in series with the first connection switching unit between the control line and the low potential line and cuts off the control line and the low potential line based on a potential of the low potential line, wherein the cutoff unit cuts off the control line and the low potential line, regardless of a value of the second control signal, when the potential of the low potential line becomes higher than a first threshold potential;

a high potential line to which a potential higher than the first threshold potential is applied; and a pre-stage control unit that is provided between the high potential line and the low potential line and inputs a potential of any one of the high potential line and the low potential line to the first connection switching unit, as the second control signal, wherein the first connection switching unit includes a MOSFET that becomes on when a potential input from the pre-stage control unit is higher than a second threshold potential, a second connection switching unit that switches whether or not to connect the control line and the output line, and a post-stage control unit that causes the second connection switching unit to connect the control line and the output line when the pre-stage control unit outputs a voltage higher than a predetermined third threshold potential, wherein the pre-stage control unit includes:

a first inverter that is provided between the high potential line and the low potential line and selects and outputs a potential of any one of the high potential line and the low potential line, in accordance with an input signal, a second inverter that is provided between the high potential line and the low potential line, selects a potential of any one of the high potential line and the low potential line, in accordance with an output of the first inverter, and inputs the selected potential to the MOSFET of the first connection switching unit, as the second control signal, a third inverter that is provided between the high potential line and the low potential line, selects a potential of any one of the high potential line and the low potential line, in accordance with an output of the second inverter, and inputs the potential selected by the third inverter to the cutoff unit, and a fourth inverter that is provided between the high potential line and the low potential line, selects a potential of any one of the high potential line and the low potential line, in accordance with an output of the first inverter, and inputs the potential selected by the fourth inverter to the post-stage control unit, and the cutoff unit cuts off the control line and the low potential line when an output of the third inverter is higher than the first threshold potential.

8. A driver circuit that controls an output unit that switches whether or not to supply a current to an output line, in accordance with a potential difference between a first control signal to be input and a voltage of the output line, the driver circuit comprising:

a control line that transmits the first control signal to the output unit;

a low potential line to which a predetermined reference potential is applied;

a first connection switching unit that switches whether or not to connect the control line and the low potential line, in accordance with a second control signal, one end of the first connection switching unit being connected to the control line;

a cutoff unit that is provided in series with the first connection switching unit between the control line and the low potential line and cuts off the control line and the low potential line based on a potential of the low potential line, wherein the cutoff unit cuts off the control line and the low potential line, regardless of a value of the second control signal, when the potential of the low potential line becomes higher than a first threshold potential;

a high potential line to which a potential higher than the first threshold potential is applied; and a pre-stage control unit that is provided between the high potential line and the low potential line and inputs a potential of any one of the high potential line and the low potential line to the first connection switching unit, as the second control signal, wherein the first connection switching unit includes a MOSFET that becomes on when a potential input from the pre-stage control unit is higher than a second threshold potential, a second connection switching unit that switches whether or not to connect the control line and the output line, and a post-stage control unit that causes the second connection switching unit to connect the control line and the output line when the pre-stage control unit outputs a voltage higher than a predetermined third threshold potential, wherein the pre-stage control unit includes:

a first inverter that is provided between the high potential line and the low potential line and selects and outputs a potential of any one of the high potential line and the low potential line, in accordance with an input signal, a second inverter that is provided between the high potential line and the low potential line, selects a potential of any one of the high potential line and the low potential line, in accordance with an output of the first inverter, and inputs the selected potential to the MOSFET of the first connection switching unit and the post-stage control unit, and a third inverter that is provided between the high potential line and the low potential line, and selects a potential of any one of the high potential line and the low potential line, in accordance with an output of the second inverter, and inputs the potential selected by the third inverter to the cutoff unit, and the cutoff unit cuts off the control line and the low potential line when an output of the third inverter is higher than the first threshold potential.

* * * * *